US010277000B2

(12) United States Patent
Yang et al.

(10) Patent No.: US 10,277,000 B2
(45) Date of Patent: Apr. 30, 2019

(54) BROADBAND LIGHT SOURCE COMPOSED OF SUPERCONTINUUM LIGHT SOURCE AND SINGLE-WAVELENGTH SEMICONDUCTOR LASER DIODES

(71) Applicant: WUHAN YANGTZE SOTON LASER CO. LTD., Hubei (CN)

(72) Inventors: Weijia Yang, Hubei (CN); Kangkang Chen, Hubei (CN)

(73) Assignee: WUHAN YANGTZE SOTON LASER CO. LTD., Hubei (CN)

( * ) Notice: Subject to any disclaimer, the term of this patent is extended or adjusted under 35 U.S.C. 154(b) by 0 days.

(21) Appl. No.: 15/740,812

(22) PCT Filed: Jun. 17, 2016

(86) PCT No.: PCT/CN2016/086246
§ 371 (c)(1),
(2) Date: May 10, 2018

(87) PCT Pub. No.: WO2017/000799
PCT Pub. Date: Jan. 5, 2017

(65) Prior Publication Data
US 2018/0254595 A1 Sep. 6, 2018

(30) Foreign Application Priority Data
Jul. 2, 2015 (CN) .......................... 2015 1 0381191

(51) Int. Cl.
*H01S 3/067* (2006.01)
*H01S 5/022* (2006.01)
(Continued)

(52) U.S. Cl.
CPC .......... *H01S 3/06758* (2013.01); *G02F 1/365* (2013.01); *H01S 3/06725* (2013.01);
(Continued)

(58) Field of Classification Search
CPC .... H01S 3/06758; H01S 3/06725; H01S 3/10; H01S 3/23; H01S 3/02284; H01S 3/5018
See application file for complete search history.

(56) References Cited

U.S. PATENT DOCUMENTS

2014/0233091 A1\* 8/2014 Clowes ................. G02F 1/365
359/341.1

FOREIGN PATENT DOCUMENTS

CN 102593701 7/2012
CN 202487963 10/2012
(Continued)

OTHER PUBLICATIONS

"First Office Action of China Counterpart Application", dated Jun. 28, 2017, p. 1-p. 6, in which the listed references (Ref. 1-5) were cited.
(Continued)

*Primary Examiner* — Armando Rodriguez
(74) *Attorney, Agent, or Firm* — JCIPRNET

(57) ABSTRACT

A novel broadband light source composed of supercontinuum light source and high-power single-wavelength semiconductor laser diodes. It includes an electronics control board, a supercontinuum light source, and a series of single-wavelength semiconductor laser diodes. The frequency of each single-wavelength semiconductor laser diodes is adjusted to integer times or division times of a frequency of the supercontinuum light source by using the electronics control board. Weaknesses of the supercontinuum light source that it is difficult to cover a wavelength less than 400 nm and power density at a wavelength of 400-2400 nm is less than 10 mW/nm are compensated by using the single-wavelength semiconductor lasers. Wavelengths of the single-wavelength semiconductor laser diodes can cover 375-2400 nm, and the highest power density can reach 200 mW/nm, so that the novel broadband light source
(Continued)

composed by the single-wavelength semiconductor laser diodes is applicable to a field such as spectral microscopy in a range of 375-400 nm. In addition, by means of electronics clock control on the single-wavelength semiconductor laser diodes and a pulse generation circuit of the supercontinuum light source, same-phase output of the single-wavelength semiconductor laser diodes and the supercontinuum light source can be kept, and relative pulse delays are flexible and adjustable.

3 Claims, 3 Drawing Sheets

(51) Int. Cl.
*H01S 5/50* (2006.01)
*G02F 1/365* (2006.01)
*H01S 5/042* (2006.01)
*H01S 5/40* (2006.01)

(52) U.S. Cl.
CPC ........ *H01S 5/02284* (2013.01); *H01S 5/5018* (2013.01); *H01S 5/0428* (2013.01); *H01S 5/4025* (2013.01)

(56) References Cited

FOREIGN PATENT DOCUMENTS

| | | |
|---|---|---|
| CN | 103296569 | 9/2013 |
| CN | 103438998 | 12/2013 |
| CN | 104037615 | 9/2014 |
| CN | 104201545 | 12/2014 |
| CN | 104934844 | 9/2015 |
| DE | 102013114580 | 6/2015 |

OTHER PUBLICATIONS

"International Search Report (Form PCT/ISA/210)", dated Sep. 18, 2016, with English translation thereof, pp. 1-4.

\* cited by examiner

BROADBAND LIGHT SOURCE COMPOSED OF SUPERCONTINUUM LIGHT SOURCE AND SINGLE-WAVELENGTH SEMICONDUCTOR LASER DIODES

CROSS-REFERENCE TO RELATED APPLICATION

This application is a 371 application of the international PCT application serial no. PCT/CN2016/086246, filed on Jun. 17, 2016, which claims the priority benefit of China application no. 201510381191.5, filed on Jul. 2, 2015. The entirety of each of the above-mentioned patent applications is hereby incorporated by reference herein and made a part of this specification.

BACKGROUND OF THE INVENTION

1. Field of the Invention

The present invention relates to the field of broadband light source, and in particular, to a novel broadband light source composed of supercontinuum light source with single-wavelength semiconductor laser diodes. Moreover, the frequency and phase of the supercontinuum light source and laser diodes are generated using the same electronics module.

2. Description of Related Art

A supercontinuum source is a phenomenon in which when a short pulse passes through a nonlinear medium, a pulse spectrum is broadened due to a combined action of a series of nonlinear effects and group velocity dispersion of optical fibers. Because of features such as a large output spectrum range, good stability, and a high repetition frequency that approximates to quasi-continuity, a supercontinuum light source has important application values in many fields such as optical coherence tomography, optical microscopy imaging, optical instrument testing, fiber optic gyroscope, ultra-short pulse generation and material spectroscopy, environmental measurement, optical fiber sensing, optical metrology, laser spectroscopy, biomedicine, and optical sampling.

Currently, the rapid development of fiber lasers provides more selections for generation of a supercontinuum. For example, Chinese utility model patent "Supercontinuum Fiber Laser" with publication No. CN 202487963 U provides a supercontinuum fiber laser. The supercontinuum fiber laser directly uses a 1064 nm semiconductor laser as a seed source, and then a pulse modulation is performed by using a pulse generator to obtain a 1064 nm picosecond laser. This 1064 nm picosecond seed source obtains a high-power 1064 nm picosecond laser by using a multilevel fiber amplifier. At last, by means of fusion splicing with a photonic crystal fiber, a spectrum of the high-power picosecond laser continuously extends to two ends of 1064 nm, and a supercontinuum light source having a width of 400-2200 nm is obtained, and the output of the supercontinuum light source has features such as a wide spectrum, a high power, a single mode, and an adjustable repetition frequency. A main problem of the conventional supercontinuum fiber laser is that it is very difficult to cover an ultraviolet spectrum range less than 400 nm, and a large quantity of measurement requirements that need ultraviolet spectrum components cannot be satisfied. Moreover, spectrum power density of the conventional supercontinuum fiber laser is not enough and is usually less than 10 mW/nm. Consequently, the conventional supercontinuum fiber laser is limited in a field needing an ultraviolet spectrum, such as a field of fluorescent spectrum imaging stimulated by the ultraviolet spectrum, and a field needing a single point power density greater than 50 mW/nm, such as a field of a flow cytometer or high-speed super-resolution optical imaging.

SUMMARY OF THE INVENTION

The technical problem that the present invention intends to resolve is to overcome the foregoing disadvantages of the prior art, provides a novel broadband light source composed of supercontinuum light and high-power single-wavelength semiconductor laser diodes. The broadband light source can simultaneously cover light less than 400 nm, resolve disadvantages of supercontinuum single point power, and enable pulses of all output ends to be adjustable in a time domain.

To resolve the foregoing technical problem, technical solutions used by the present invention are:

A novel broadband light source composed of supercontinuum light source and the high-power single-wavelength semiconductor laser diodes. The broadband light source includes an electronics control board for controlling the phase and frequency of the super continuum source and laser diodes, a traditional supercontinuum light source, and a series of single-wavelength semiconductor laser diodes.

According to the foregoing solution, the electronics control board includes a clock, a same-frequency same-phase module, and a plurality of delay and frequency multiplication/frequency division modules.

According to the foregoing solution, the supercontinuum light source includes a pulse generator, a semiconductor laser diode, a first-level fiber amplifier, a second-level fiber amplifier, a third-level fiber amplifier, and a PCF photonic crystal fiber that are sequentially connected.

The working principle of the present invention is: The electronics control board is configured to control a frequency and a phase of each single-wavelength semiconductor laser diode, and the single-wavelength semiconductor laser diodes are configured to broaden a band and single point light power of the supercontinuum light source. A band that is not covered in the supercontinuum light source is compensated and a single point power deficit in the supercontinuum light source is supplemented by using the single-wavelength semiconductor laser diodes, and the same-source multi-path clock enables pulses of output ends of all the single-wavelength semiconductor laser diodes to be adjustable in a time domain.

Compared with the prior art, the present invention has the following beneficial effects:

1. Weaknesses of the conventional supercontinuum light source that it is difficult to cover a wavelength less than 400 nm and single-wavelength power density at a location of 400-2400 nm is less than 10 mW/nm are compensated by means of adding the single-wavelength semiconductor laser diodes. Wavelengths of the added single-wavelength semiconductor laser diodes can cover 375 nm-2400 nm, and the highest single-wavelength power density can reach 200 mW/nm, so that the novel supercontinuum light source composed by the single-wavelength semiconductor laser diodes is applicable to a field such as spectral microscopy in a range of 375-400 nm, and is more suitable to be applied to fields such as confocal microscopy, super-resolution optical imaging, and flow cytometer that need high-power density.

2. By means of clock control on the single-wavelength semiconductor laser diodes and a pulse generation circuit of a conventional supercontinuum light source, same-phase output of the single-wavelength semiconductor laser diodes and the conventional supercontinuum light source can be kept, and relative pulse delays are flexible and adjustable. A hybrid supercontinuum light source whose same-phase pulse delays are controllable can be applied to a field such as a super-resolution microscopy technology, and a transient spectrum and microscopy that are related to a time resolution.

Figure 1:
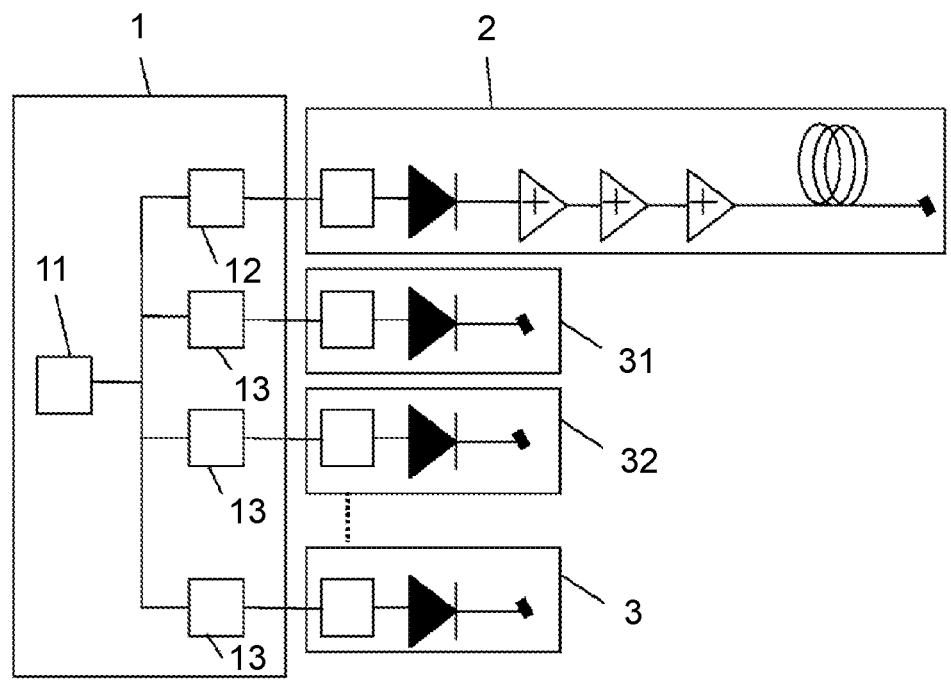
FIG. 1 is schematic structural diagram of a novel broadband light source according to the present invention.

In the drawings, 1 represents an electronics control board, 11 represents a clock, 12 represents a same-frequency same-phase module, 13 represents a delay and frequency multiplication/frequency division module, 2 represents a supercontinuum light source SC, 21 represents a pulse generator, 22 represents a semiconductor laser diode, 23 represents a first-level fiber amplifier, 24 represents a second-level fiber amplifier, 25 represents a third-level fiber amplifier, 26 represents a PCF photonic crystal fiber, 3 represents a single-wavelength semiconductor laser diode, 31 represents a 375 nm-70 mW single-wavelength semiconductor laser diode, and 32 represents a 780 nm-7 mW single-wavelength semiconductor laser diode.

DESCRIPTION OF THE EMBODIMENTS

To make the objectives, technical solutions, and advantages of the present invention clearer and more comprehensible, the following further describes the present invention in detail with reference to the accompanying drawings and embodiments.

Figure 2:
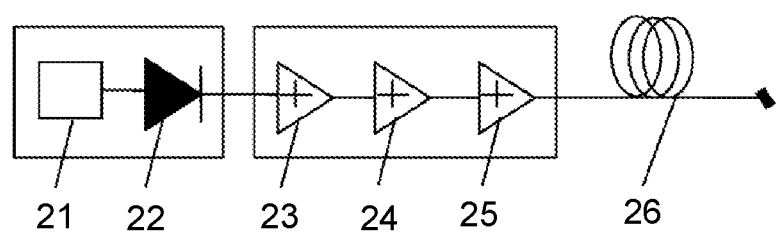
FIG. 2 is a structural diagram of a supercontinuum light source in FIG. 1.

As shown in FIG. 1 and FIG. 2, a novel broadband light source possessing same-phase high-power single-wavelength semiconductor laser diodes according to the present invention includes a electronics control board 1, a supercontinuum light source 2, and a plurality of single-wavelength semiconductor laser diodes 3. Frequencies f1-fn of the single-wavelength semiconductor laser diodes 3 are adjusted to integer times or division times of a frequency P0 of the supercontinuum light source 2 by using the electronics control board 1.

The electronics control board 1 includes a clock 11, a same-frequency same-phase module 12, and a plurality of delay and frequency multiplication/frequency division modules 13.

The supercontinuum light source 2 includes a pulse generator 21, a semiconductor laser diode 22, a first-level fiber amplifier 23, a second-level fiber amplifier 24, a third-level fiber amplifier 25, and a PCF photonic crystal fiber 26 that are sequentially connected.

The core of the present invention is that a band that is not covered in the supercontinuum light source 2 is compensated and a single point power deficit in the supercontinuum light source 2 is supplemented by using the single-wavelength semiconductor laser diodes 3, and the electronics control board 1 enables pulses of output ends of all the single-wavelength semiconductor laser diodes 3 to be adjustable in a time domain.

Embodiment 1

Figure 3:
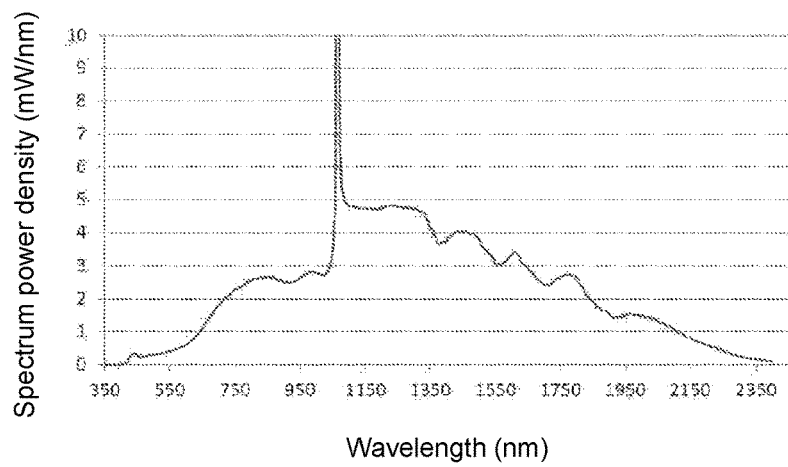
FIG. 3 is a spectrogram of a conventional supercontinuum light source.
Figure 4:
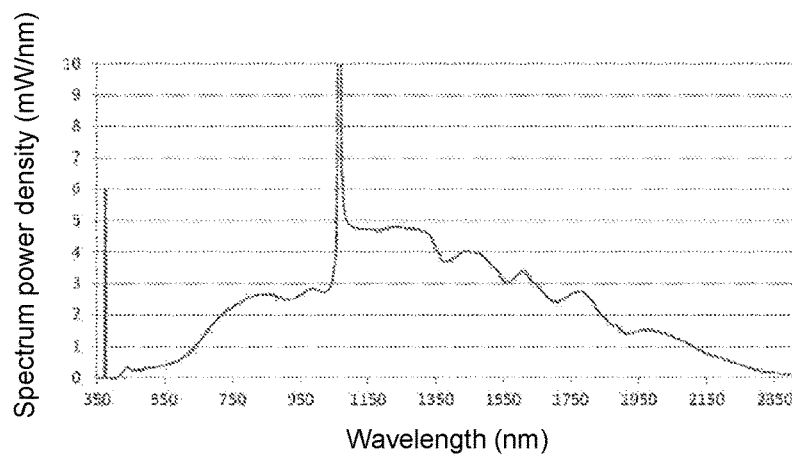
FIG. 4 is a diagram of compensating a blank at a wavelength of 375 nm by a novel broadband light source according to the present invention.

As shown in FIG. 1, a novel broadband light source possessing same-phase high-power single-wavelength semiconductor laser diodes according to the present invention includes a electronics control board 1, a supercontinuum light source 2, and a 375 nm-6 mW single-wavelength semiconductor laser diode 31 (LD1). An output spectrogram of this novel broadband light source is shown in FIG. 4. It can be learned by means of comparing FIG. 3 with FIG. 4 that the novel broadband light source according to the present invention compensates a blank at a wavelength of 375 nm.

Embodiment 2

Figure 5:
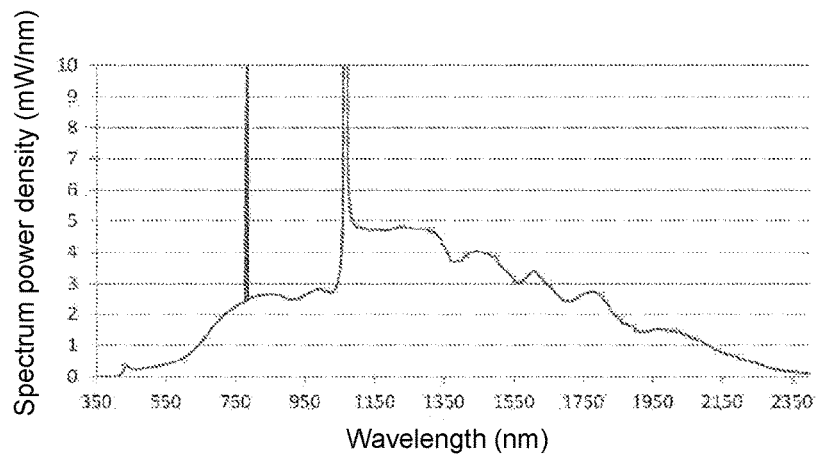
FIG. 5 is a diagram of increasing power density at a wavelength of 780 nm by a novel broadband light source according to the present invention.

As shown in FIG. 1, a novel broadband light source possessing same-phase high-power single-wavelength semiconductor laser diodes according to the present invention includes an electronics control board 1, a supercontinuum light source 2, and a 780 nm-7 mW single-wavelength semiconductor laser diode 32 (LD1). An output spectrogram of this novel broadband light source is shown in FIG. 5. It can be learned by means of comparing FIG. 3 with FIG. 5 that the novel broadband light source according to the present invention increases power density at a wavelength of 780 nm.

Embodiment 3

Figure 6:
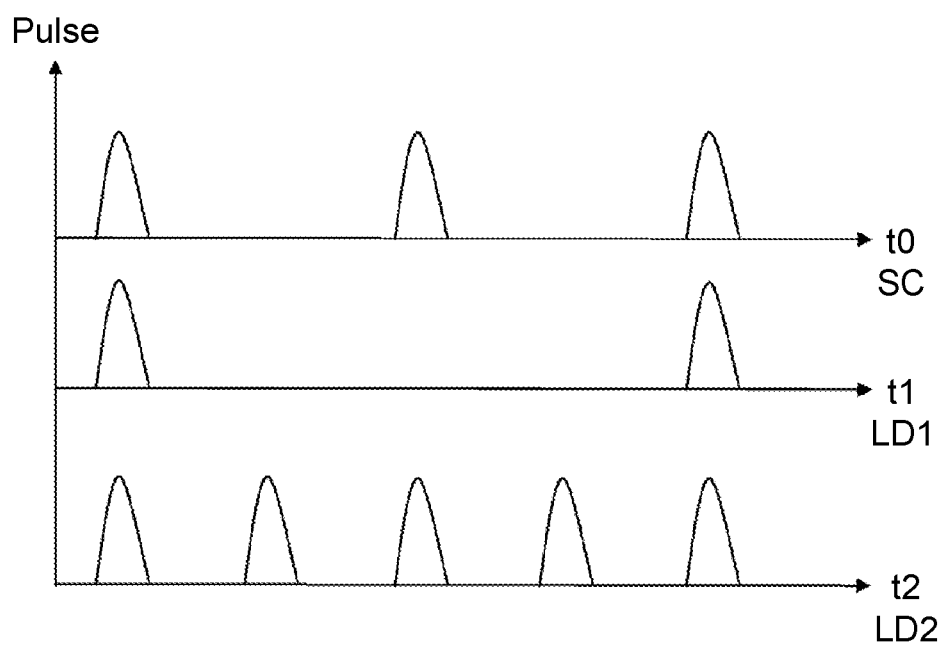
FIG. 6 is a diagram of pulses output from output ends of a novel broadband light source according to the present invention.

As shown in FIG. 1, a novel broadband light source possessing same-phase high-power single-wavelength semiconductor laser diodes according to the present invention includes a electronics control board 1, a supercontinuum light source 2, a 375 nm-70 mW single-wavelength semiconductor laser diode 31 (LD1), and a 780 nm-250 mW single-wavelength semiconductor laser diode 32 (LD2). A frequency f1 of the single-wavelength semiconductor laser diode LD1, and a frequency 12 and a phase of the single-wavelength semiconductor laser diode LD2 are controlled by using the delay and frequency multiplication/frequency division modules 13 in the electronics control board 1. As shown in FIG. 6, pulses output from output ends of this novel broadband light source are in a same phase, f1=1/2 f0, f2=2 f0, and adjustment can be made according to application requirements.

The present invention is not merely limited to the applications listed in the specification and the embodiments. A person skilled in the art can make various corresponding modifications and variations according to the present invention, and all the corresponding modifications and variations fall with the protection scope of the appended claims of the present invention.

What is claimed is:

1. A novel broadband light source, comprising:
a supercontinuum light source and high-power single-wavelength semiconductor laser diodes, wherein the supercontinuum light source and the high-power single-wavelength semiconductor laser diodes have a same electronics control board, the electronics control board adjusts a frequency of each of the single-wavelength semiconductor laser diode to integer times or division times of a frequency of the supercontinuum light source and controls a time delay of each of the single-wavelength semiconductor laser diodes.

2. The novel broadband light source according to claim 1, wherein the electronics control board comprises a clock, a same-frequency same-phase module, and a plurality of delay and frequency multiplication/frequency division modules.

3. The novel broadband light source according to claim 1, wherein the supercontinuum light source comprises a pulse generator, a semiconductor laser diode, a first-level fiber amplifier, a second-level fiber amplifier, a third-level fiber amplifier, and a PCF photonic crystal fiber that are sequentially connected.

\* \* \* \* \*